United States Patent
Lee et al.

(10) Patent No.: US 8,772,106 B2
(45) Date of Patent: Jul. 8, 2014

(54) GRADED METAL OXIDE RESISTANCE BASED SEMICONDUCTOR MEMORY DEVICE

(71) Applicant: Macronix International Co., Ltd., Hsinchu (TW)

(72) Inventors: Ming-Daou Lee, Chiayi (TW); Erh-Kun Lai, Elmsford, NY (US); Kuang-Yeu Hsieh, Hsinchu (TW); Wei-Chih Chien, Taipei (TW); Chien Hung Yeh, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/937,465

(22) Filed: Jul. 9, 2013

(65) Prior Publication Data
US 2013/0295719 A1 Nov. 7, 2013

Related U.S. Application Data

(62) Division of application No. 12/431,983, filed on Apr. 29, 2009, now Pat. No. 8,488,362.

(51) Int. Cl.
*H01L 21/00* (2006.01)
*H01L 21/16* (2006.01)
*H01L 21/8234* (2006.01)
*H01L 21/8244* (2006.01)
*H01L 21/8222* (2006.01)

(52) U.S. Cl.
USPC ........... 438/257; 438/104; 438/237; 438/328; 438/778; 438/795; 257/E21.003; 257/E21.004; 257/E21.645

(58) Field of Classification Search
None
See application file for complete search history.

(56) References Cited

U.S. PATENT DOCUMENTS

| | | |
|---|---|---|
| 5,933,365 A | 8/1999 | Klersy et al. |
| 6,839,262 B2 | 1/2005 | Vyvoda et al. |
| 7,084,691 B2 | 8/2006 | Hsu |
| 7,098,101 B1 | 8/2006 | Li et al. |
| 7,126,152 B2 | 10/2006 | Ishida et al. |
| 7,667,220 B2 | 2/2010 | Ho et al. |

(Continued)

FOREIGN PATENT DOCUMENTS

WO 2009002477 A1 12/2008

OTHER PUBLICATIONS

Baik, I.G., "Highly Scalable Non-volatile Resistive Memory using Simple Binary Oxide Driven by Asymmetric Unipolar Voltage Pulses," IEEE IEDM2004 4 pages.

(Continued)

*Primary Examiner* — Mohsen Ahmadi
(74) *Attorney, Agent, or Firm* — Haynes Beffel Wolfeld LLP

(57) ABSTRACT

Memory devices are described along with methods for manufacturing and methods for operating. A memory device as described herein includes a plurality of memory cells located between word lines and bit lines. Memory cells in the plurality of memory cells comprise a diode and a metal-oxide memory element programmable to a plurality of resistance states including a first and a second resistance state, the diode of the memory element arranged in electrical series along a current path between a corresponding word line and a corresponding bit line. The device further includes bias circuitry to apply bias arrangements across the series arrangement of the diode and the memory element of a selected memory cell in the plurality of memory cells.

5 Claims, 17 Drawing Sheets

(56) References Cited

U.S. PATENT DOCUMENTS

| | | |
|---|---|---|
| 7,705,343 B2 | 4/2010 | Suh et al. |
| 7,742,332 B2 | 6/2010 | Nakai |
| 7,800,094 B2 | 9/2010 | Ho et al. |
| 7,867,814 B2 | 1/2011 | Nihei et al. |
| 7,960,224 B2 | 6/2011 | Chien et al. |
| 8,488,362 B2 | 7/2013 | Lee et al. |
| 2005/0260839 A1 | 11/2005 | Allenspach et al. |
| 2006/0109704 A1 | 5/2006 | Seo et al. |
| 2006/0131554 A1 | 6/2006 | Joung et al. |
| 2006/0203430 A1 | 9/2006 | Pinnow et al. |
| 2006/0266993 A1 | 11/2006 | Suh et al. |
| 2006/0274574 A1 | 12/2006 | Choi et al. |
| 2007/0045692 A1 | 3/2007 | Kim et al. |
| 2007/0114587 A1 | 5/2007 | Seo et al. |
| 2008/0044986 A1* | 2/2008 | Storbeck et al. ............. 438/471 |
| 2008/0089111 A1 | 4/2008 | Lee et al. |
| 2008/0304312 A1 | 12/2008 | Ho et al. |
| 2010/0054014 A1* | 3/2010 | Lee et al. ..................... 365/148 |
| 2010/0148142 A1* | 6/2010 | Chien et al. ..................... 257/4 |

OTHER PUBLICATIONS

Ho, Chiahua, et al., "A Highly Reliable Self-Aligned Graded Oxide WO.sub.x Resistance Memory: Conduction Mechanisms and Reliability," 2007 Symposium on VLSI Technology Digest of Technical Papers, Jun. 12-14, 2007, 228-229.

Hosoi, Y., et al., "High Speed Unipolar Switching Resistance RAM (RRAM) Technology," IEEE IEDM Dec. 11-13, 2006, 4 pages.

Lee, Dongsoon, et al., "Resistance Switching of the Nonstoichiometric Zirconium Oxide for Nonvolatiel Memory Applications," IEEE Electron Device Letters vol. 26, No. 9, Oct. 2005, 3 pages.

* cited by examiner

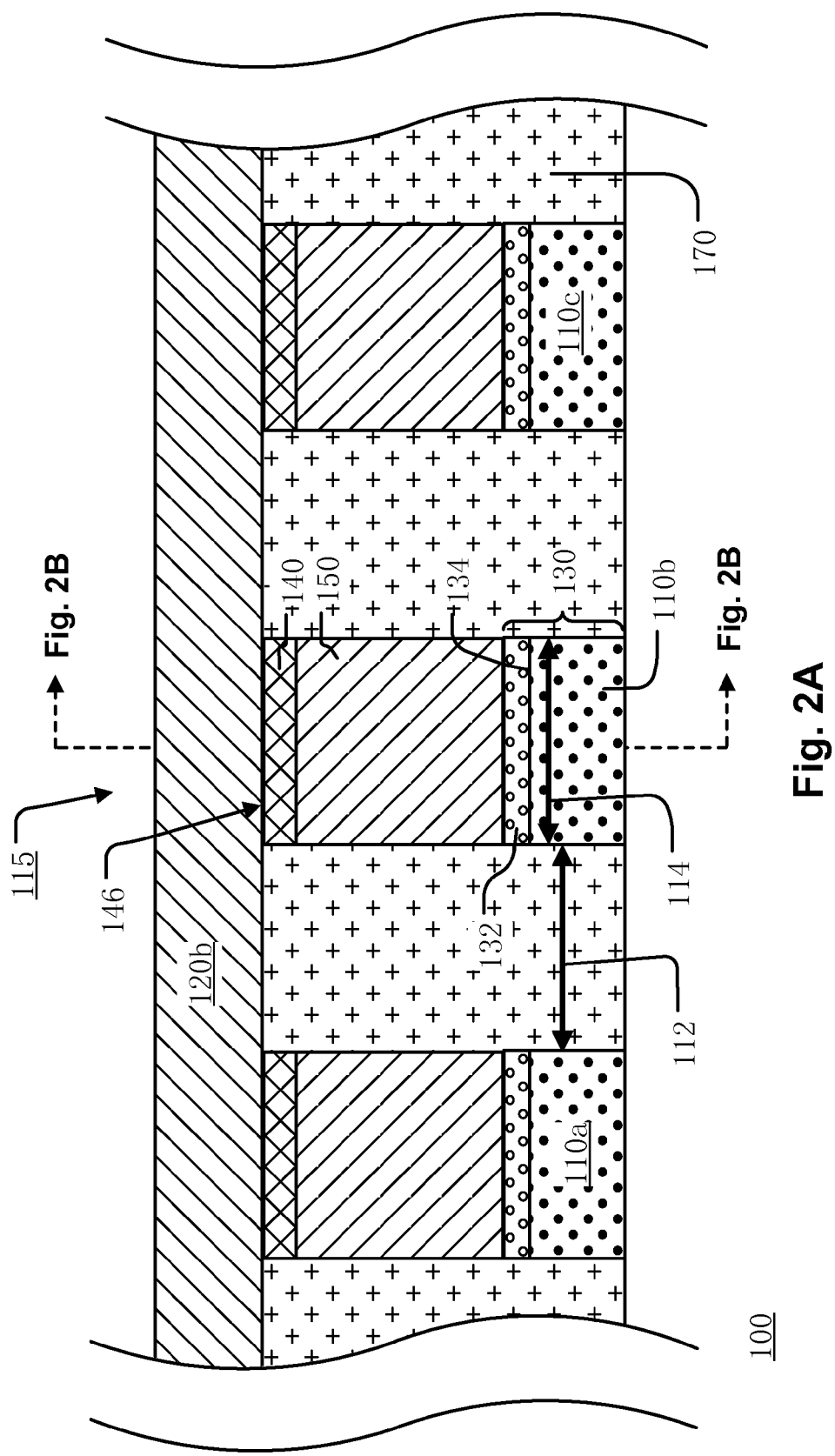

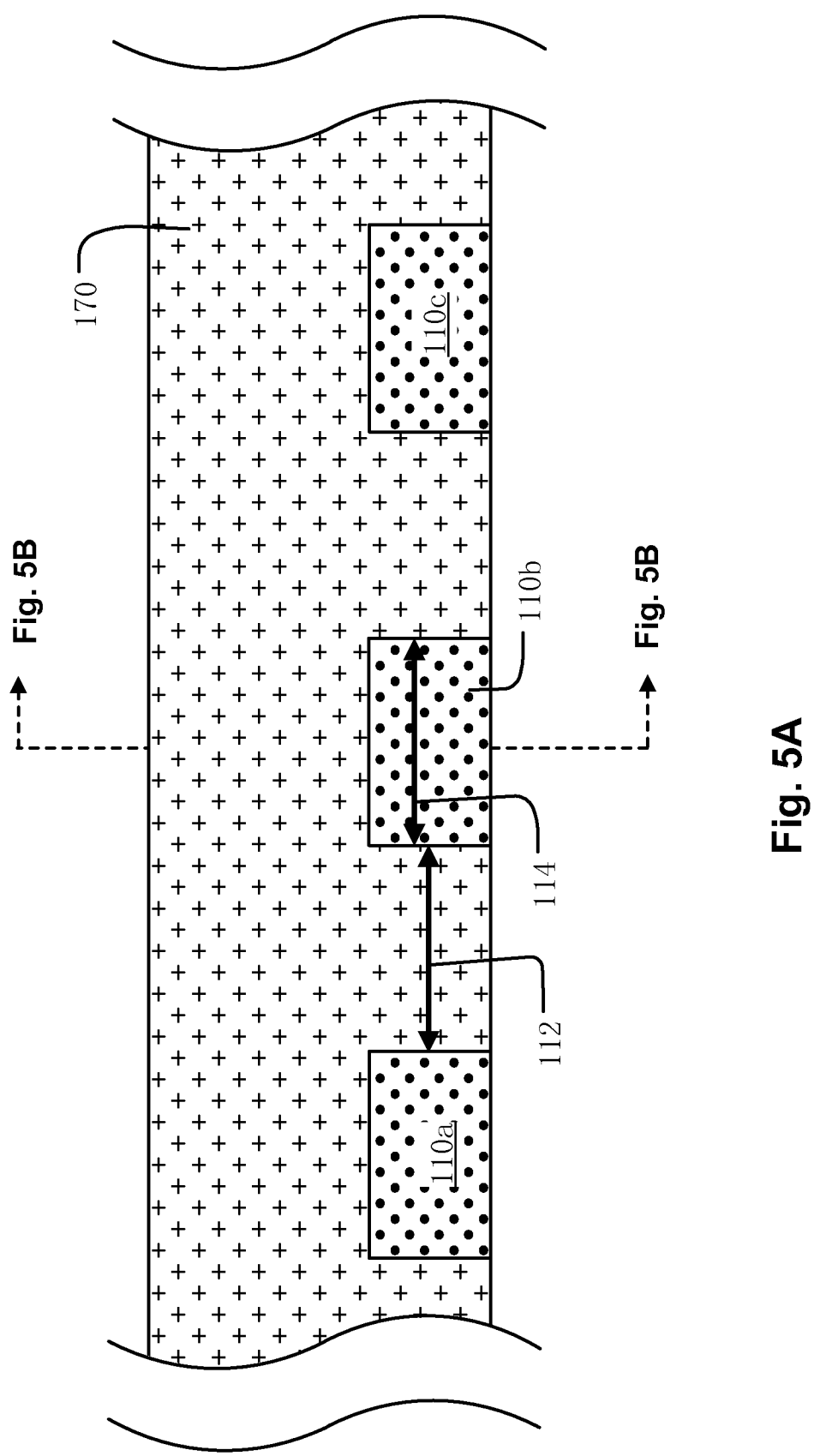

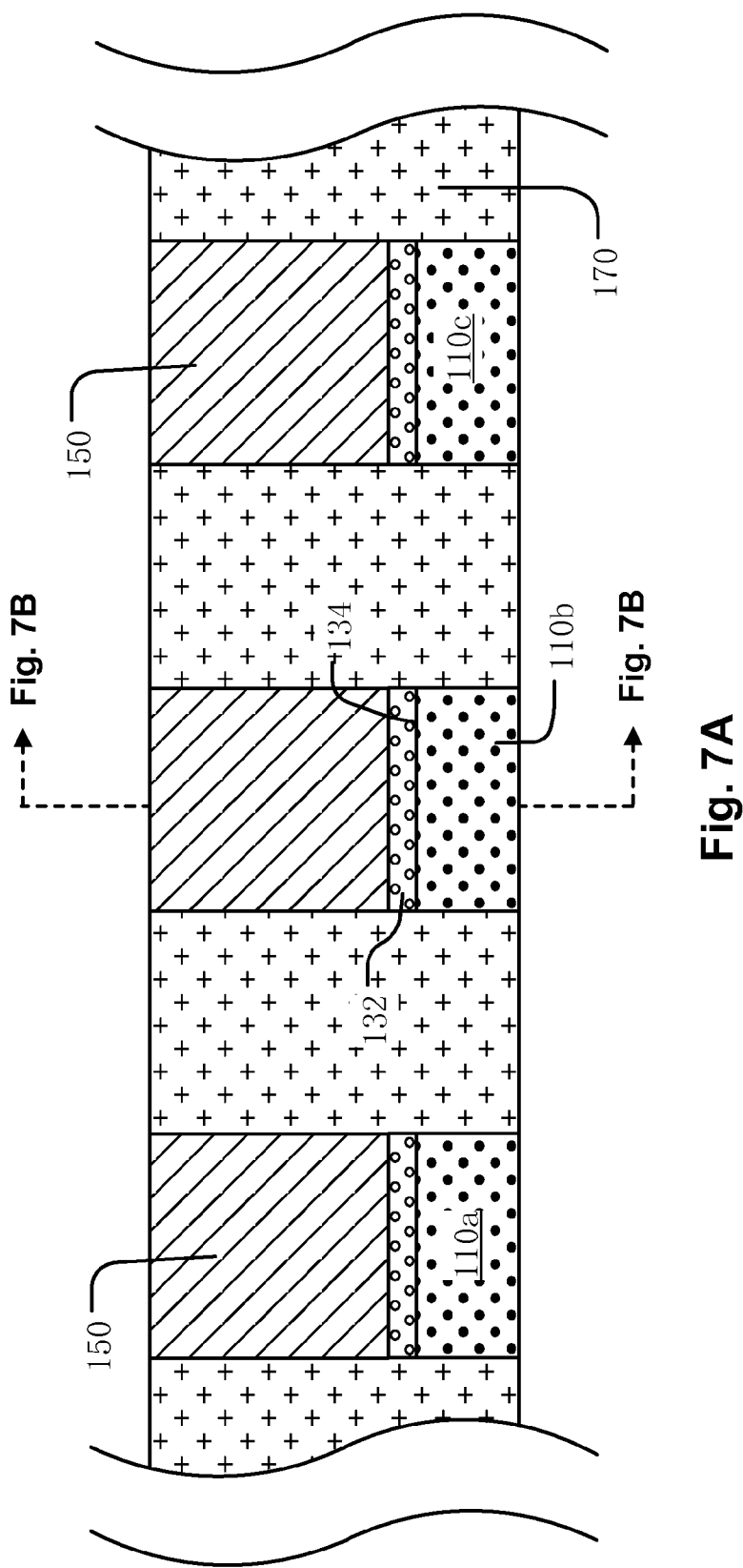

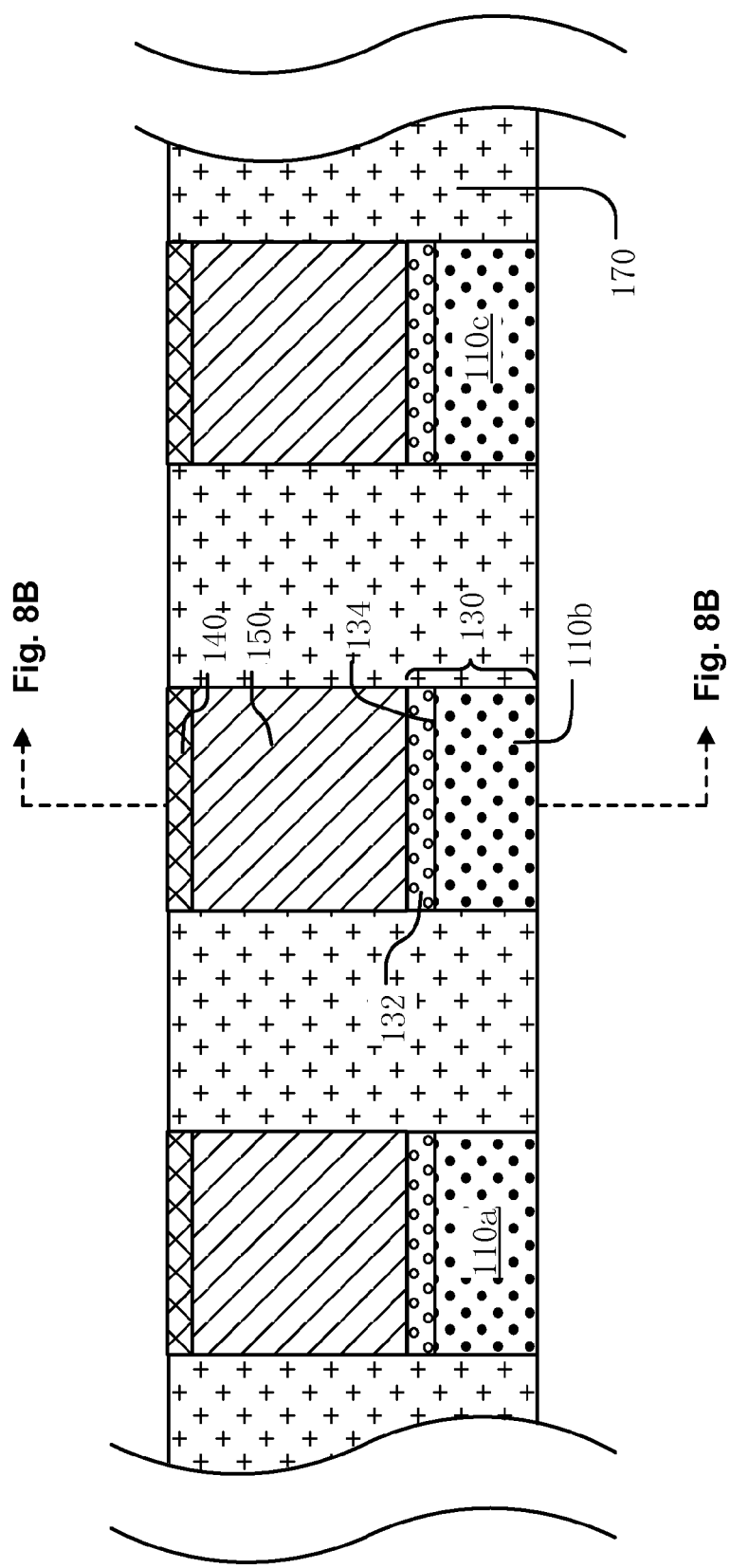

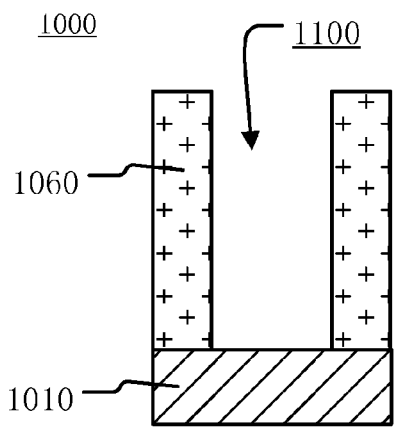
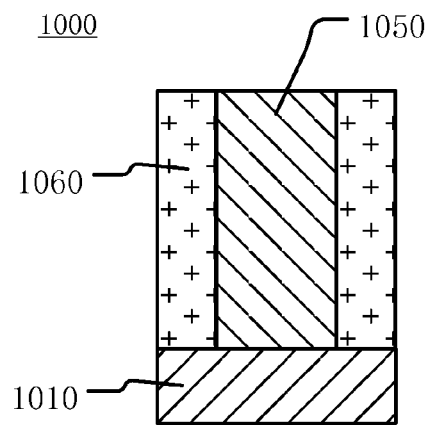
FIG. 10A                    FIG. 10B
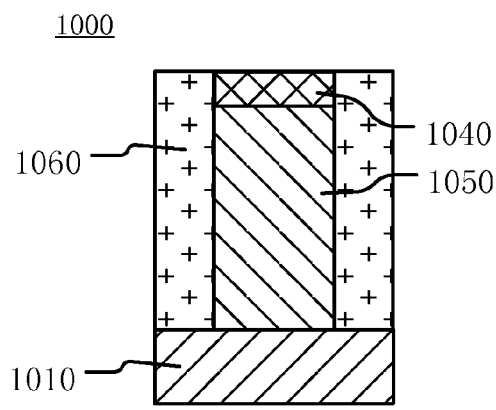
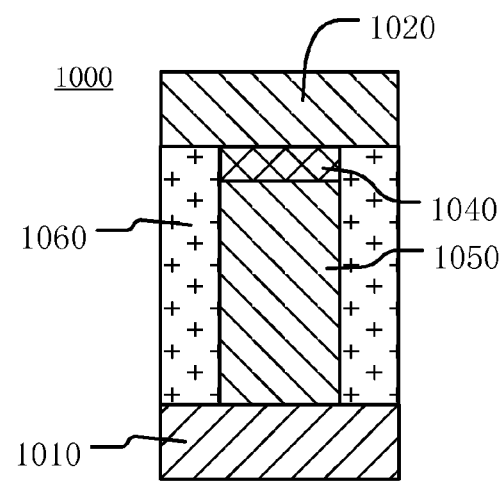
FIG. 10C                    FIG. 10D

GRADED METAL OXIDE RESISTANCE BASED SEMICONDUCTOR MEMORY DEVICE

BACKGROUND OF THE INVENTION

This application is a divisional application of U.S. patent application Ser. No. 12/431,983 filed 29 Apr. 2009, which application is incorporated by reference as if fully set forth herein.

FIELD OF THE INVENTION

The present invention relates to metal-oxide based memory devices, methods for manufacturing such devices, and methods for operating such devices.

DESCRIPTION OF RELATED ART

Various metal-oxide materials have been proposed for use in high density one-time programmable (OTP) memory having diode access devices. Metal-oxide based OTP memory is programmed by applying a voltage across the metal-oxide material to cause a permanent change in the resistance of the material. A representative high density metal-oxide OTP memory having diode access devices is shown in U.S. Pat. No. 7,053,406.

Electrically erasable and reprogrammable nonvolatile memory offers more flexibility than OTP memory since the information stored can be written and erased numerous times. Some metal-oxides can be caused to reversibly change resistance between two or more stable resistance ranges by application of electrical pulses at levels suitable for implementation in integrated circuits, thus providing a basis for use in nonvolatile resistive random access memory RRAM.

Transistor access devices have been proposed as drivers for metal-oxide based electrically erasable and reprogrammable nonvolatile memory. See, for example, U.S. patent application Ser. No. 11/955,137 (now U.S. Pat. No. 7,800,094). However, transistors have a large cross-sectional area than diodes and thus suffer from a lower memory density than OTP memory devices using diode access devices.

It is therefore desirable to provide an electrically erasable and reprogrammable metal-oxide based memory cell structure having diode access devices for use in high-density memory devices. It is also desirable to provide methods for manufacturing which address the tight process requirements needed for large-scale high density devices.

SUMMARY OF THE INVENTION

An electrically erasable and reprogrammable metal-oxide based memory cell structure that includes a diode access device for implementation in high density devices is described herein. The electrically erasable and reprogrammable metal-oxide based memory cell is written and erased using bias arrangements which forward bias the diode access device to reversibly change the resistance of a memory-oxide memory element among a plurality of resistance states. Methods for manufacturing such devices are also described herein.

A memory device as described herein includes a plurality of word lines, a plurality of bit lines, and a plurality of memory cells located between the word lines and bit lines. Memory cells in the plurality of memory cells comprise a diode and a metal-oxide memory element programmable to a plurality of resistance states including a first and a second resistance state, the diode and the memory element arranged in electrical series along a current path between a corresponding word line in the plurality of word lines and a corresponding bit line in the plurality of bit lines. The device further includes bias circuitry to apply bias arrangements across the series arrangement of the diode and the memory element of a selected memory cell in the plurality of memory cells. The bias arrangements include a first bias arrangement to forward-bias the diode of the selected memory cell and change the resistance state of the memory element of the selected memory cell from the first resistance state to the second resistance state. The bias arrangements further include a second bias arrangement to forward-bias the diode of the selected memory cell and change the resistance state of the memory element of the selected memory cell from the second resistance state to the first resistance state.

A method for manufacturing a memory device as described herein includes forming a plurality of word lines comprising doped semiconductor material having a first conductivity type. A dielectric is formed overlying the word lines and an array of vias are formed in the dielectric to expose portions of the word lines. A plurality of doped semiconductor regions are formed within the exposed portions of the word lines, the doped semiconductor regions having a conductivity type opposite the first conductivity type. A plurality of metal-oxide memory elements are formed within the array of vias, the metal-oxide memory elements programmable to a plurality of resistance states including a first resistance state and a second resistance state. A plurality of bit lines are formed overlying the plurality of memory elements.

A method for operating a memory device is described herein. The memory device comprises a diode and a metal-oxide memory element arranged electrically in series, the metal-oxide memory element programmable to a plurality of resistance states. The method comprises applying a bias arrangement across the series arrangement of the diode and the metal-oxide memory element to change the resistance state of the metal-oxide memory element. Applying the bias arrangement comprises applying a first bias arrangement to change the resistance states of the metal-oxide memory element from a first resistance state to a second resistance state. Applying the bias arrangement also comprises applying a second bias arrangement to forward-bias the diode and change the resistance state of the metal-oxide memory element from the second resistance state to the first resistance state.

Methods for manufacturing including curing of metal-oxide memory elements are also described herein. The curing process involves exposing the metal-oxide memory element to a gas comprising at least one of nitrogen, hydrogen, and argon, at a temperature greater 100 degrees Celsius. Curing the metal-oxide memory element as described herein is shown to result in improved resistive switching performance as well as improved cycle endurance.

The curing process can be applied during manufacturing of the metal-oxide memory elements with diode access devices described above. More generally the curing process can be performed on metal-oxide memory elements implemented in various types of memory cells, including memory cells having transistor access devices. A method for manufacturing a memory device as described herein includes forming a bottom electrode and forming a metal-oxide memory element electrically coupled to the bottom electrode. The method includes exposing the metal-oxide memory element to a gas comprising at least one of nitrogen, hydrogen, and argon, at a temperature greater than 100 degrees Celsius. The method further includes forming a top electrode on the metal-oxide memory element.

Other aspects and advantages of the present invention can be seen on review of the drawings, the detailed description, and the claims which follow.

BRIEF DESCRIPTION OF THE DRAWINGS

FIGS. 2A and 2B illustrates cross-sectional views of a portion of an embodiment of memory cells arranged in the cross point array.

FIGS. 5A, 5B, 6A, 6B, 7A, 7B, 8A, 8B illustrate steps in a fabrication sequence for manufacturing the cross-point array of memory cells as illustrated in FIGS. 2A-2B.

FIGS. 10A-10D illustrate cross-sectional views of steps in a manufacturing process for manufacturing a memory cell 1000 having a metal-oxide memory element 1040 including the use of a curing process.

DETAILED DESCRIPTION

Figure 1:
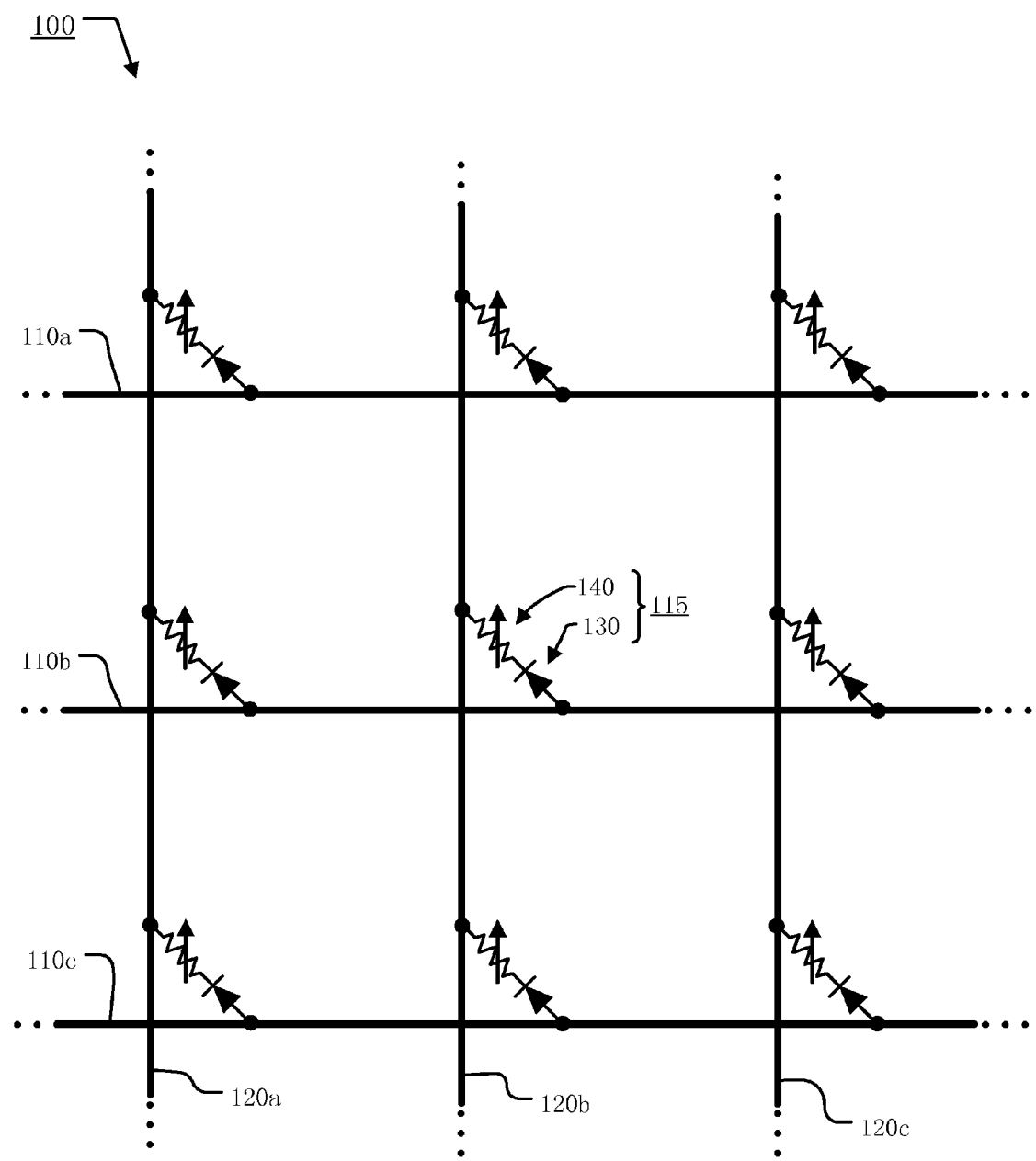
FIG. 1 illustrates a schematic diagram of a portion of a cross-point memory array implemented using memory cells as described herein.

The following description of the disclosure will typically be with reference to specific structural embodiments and methods. It is to be understood that there is no intention to limit the disclosure to the specifically disclosed embodiments and methods, but that the disclosure may be practiced using other features, elements, methods and embodiments. Preferred embodiments are described to illustrate the present disclosure, not to limit its scope, which is defined by the claims. Those of ordinary skill in the art will recognize a variety of equivalent variations on the description that follows. Like elements in various embodiments are commonly referred to with like reference numerals.

FIG. 1 illustrates a schematic diagram of a portion of a cross-point memory array 100 implemented using memory cells as described herein, each memory cell comprising a diode access device and a metal-oxide based memory element.

As shown in the schematic diagram of FIG. 1, each of the memory cells of the array 100 include a diode access device and a metal-oxide based memory element (each represented in FIG. 1 by a variable resistor) arranged in series along a current path between a corresponding word line 110 and a corresponding bit line 120. As described in more detail below, the memory element in a given memory cell is programmable to plurality of resistance states including a first and a second resistance state.

The array comprises a plurality of word lines 110 including word lines 110a, 110b, and 110c extending in parallel in a first direction, and a plurality of bit lines 120 including bit lines 120a, 120b, and 120c extending in parallel in a second direction perpendicular to the first direction. The array 100 is referred to as a cross-point array because the word lines 110 and bit lines 120 cross each other but do not physically intersect, and the memory cells are located at these cross-point locations of the word lines 110 and bit lines 120.

Memory cell 115 is representative of the memory cells of array 100 and is arranged at the cross-point location of the word line 110b and the bit line 120b, the memory cell 115 comprising a diode 130 and a memory element 140 arranged in series. The diode 140 is electrically coupled to the word line 110b and the memory element 140 is electrically coupled to the bit line 120b.

Reading or writing to memory cell 115 of array 100 can be achieved by applying appropriate voltage pulses to the corresponding word line 110b and bit line 120b to induce a current through the selected memory cell 115. The level and duration of the voltages applied is dependent upon the operation performed, e.g. a reading operation or a programming operation.

Figure 9:
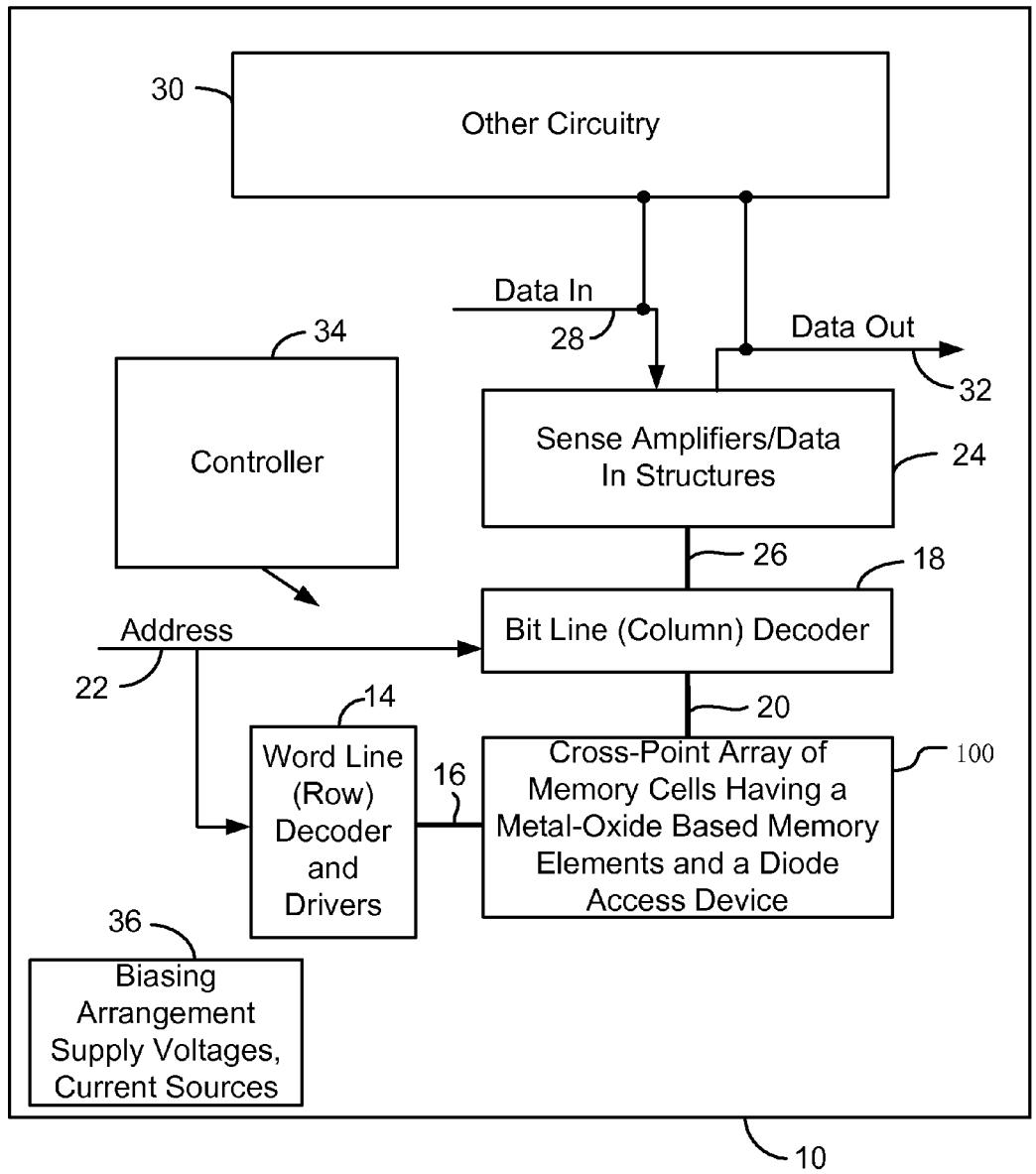
FIG. 9 is a simplified block diagram of an integrated circuit including a cross-point array of memory cells having a metal-oxide based memory element and a diode access device as described herein.

In a read (or sense) operation of the data value stored in the memory cell 115, bias circuitry (See, for example, biasing arrangement supply voltages, current sources 36 of FIG. 9) coupled to the corresponding word line 110b and bit line 120b to apply bias arrangements across the memory cell 115 of suitable amplitude and duration to induce current to flow which does not result in the memory element 140 undergoing a change in resistive state. The current through the memory cell 115 is dependant upon the resistance of the memory element 140 and thus the data value stored in the memory cell 115. The data value may be determined, for example, by comparison of the current on the bit line 120b with a suitable reference current by sense amplifiers (See, for example, sense amplifiers/data in structures 24 of FIG. 9).

In a program operation of a data value to be stored in the memory cell 115, bias circuitry (See, for example, biasing arrangement supply voltages, current sources 36 of FIG. 9) coupled to the corresponding word line 110b and bit line 120b to apply bias arrangements across the memory cell 115 of suitable amplitude and duration to induce a programmable change in the memory elements 140 to store the data value in the memory cell 115, the electrical resistance of the memory element 140 corresponding to the data value stored in the memory cell 115.

The bias arrangements include a first bias arrangement sufficient to forward bias the diode 130 and change the resistance state of the memory element 140 from a resistance corresponding to a first programmed state to a resistance corresponding to a second programmed state. The bias arrangements also include a second bias arrangement sufficient to forward bias the diode 130 and change the resistance state of the memory element 140 from a resistance corresponding to the second programmed state to a resistance corresponding to the first programmed state. In embodiments the bias arrangements for unipolar operation of the memory element 140 may each comprise one or more voltage pulses, and the voltage levels and pulse times can be determined empirically for each embodiment.

Figure 2B:
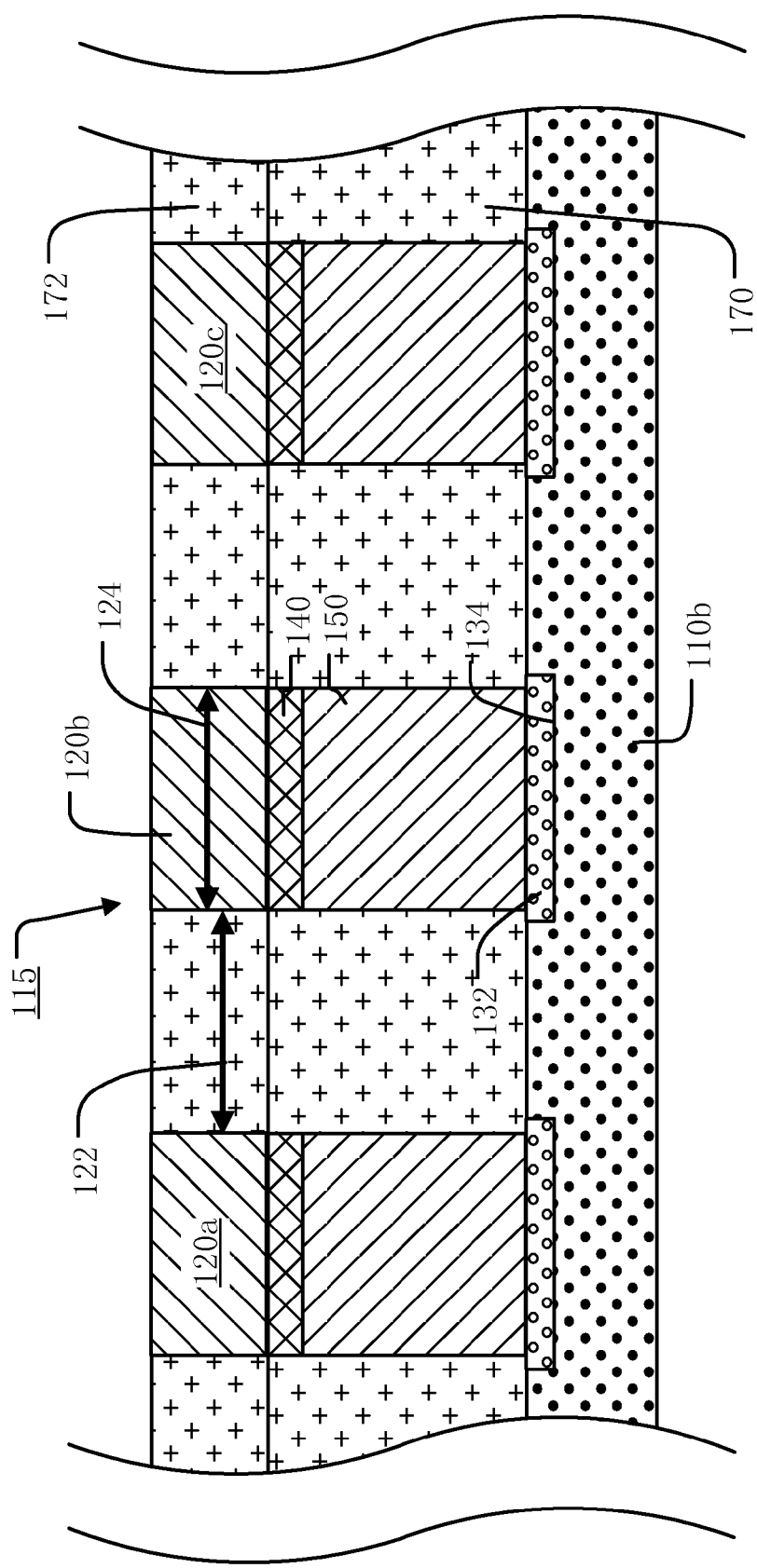
Figure 5B:
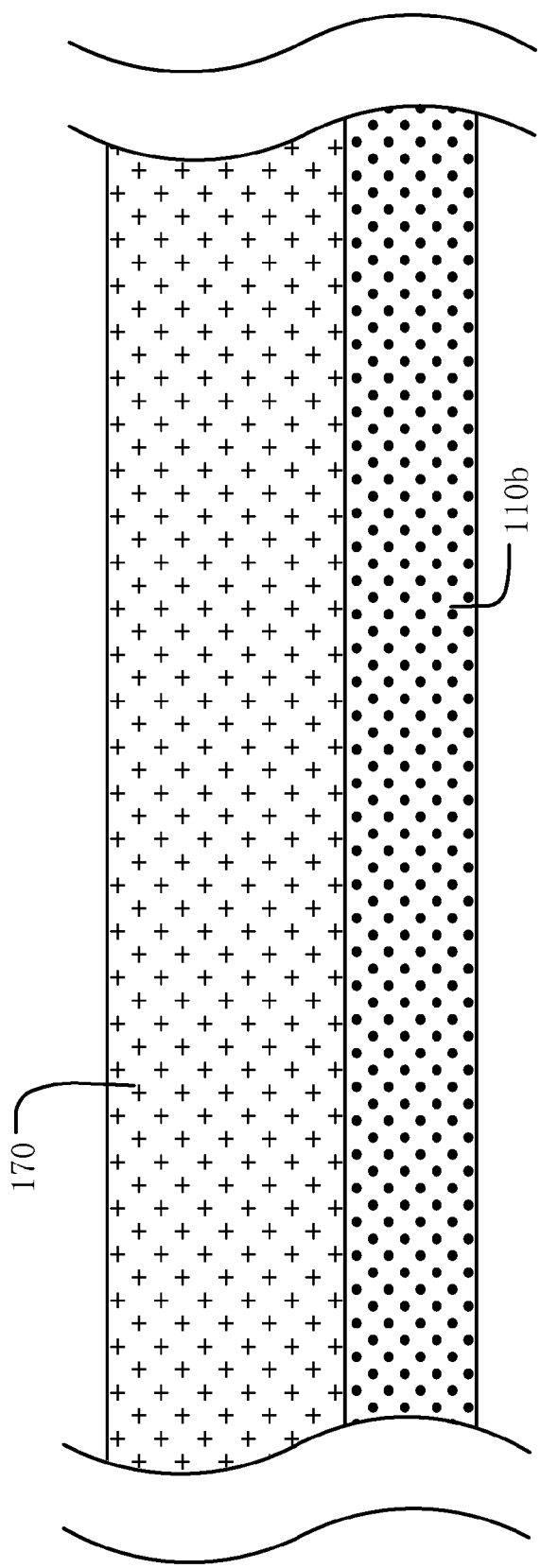

FIGS. 2A and 2B illustrate cross-sectional views of a portion of an embodiment of memory cells (including representative memory cell 115) arranged in the cross-point array 100, FIG. 2A taken along the bit lines 120 and FIG. 5B taken along the word lines 110.

Referring to FIGS. 2A and 2B, the memory cell 115 includes a doped semiconductor region 132 within the word line 110b. The word lines 110 comprise doped semiconductor material having a conductivity type opposite that of the doped semiconductor region 132. Thus, the doped semiconductor region 132 and the word line 110b define a pn junction 134 therebetween, and the diode 130 comprises the doped semiconductor region 132 and a portion of the word line 110b adjacent the doped semiconductor region 132. In the illustrated embodiment the word lines 110 comprise doped P-type semiconductor material such as polysilicon, and the doped semiconductor region 132 comprises doped N-type semiconductor material.

In an alternative embodiment the word lines 130 may comprise other conductive materials such as W, TiN, TaN, Al and the diode may be formed by first and second doped regions having different conductivity types on the word lines 110. In yet another alternative embodiment, the diode may be formed by a lightly doped region between more highly doped regions of opposite conductivity since it has been observed that the breakdown voltage of the diode can be improved.

The memory cell 115 includes a conductive element 150 extending through dielectric 170 to couple the diode 130 to memory element 140.

Figure 2C:
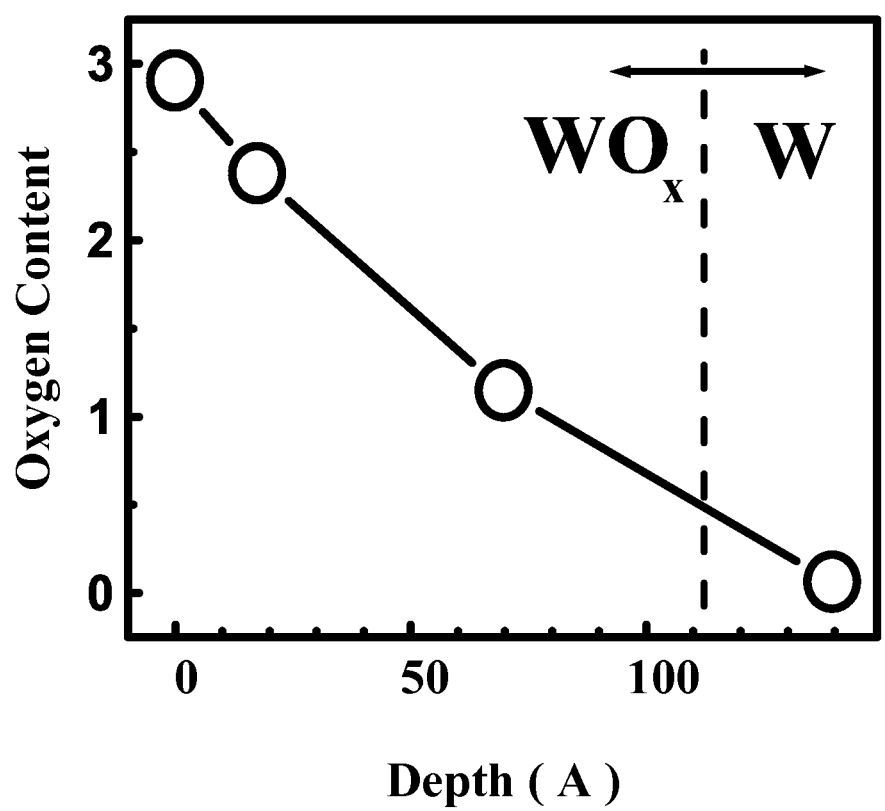
FIG. 2C illustrates the variation in distribution of W-ions with depth from a top surface of the memory element.

In the illustrated embodiment the conductive element 150 comprises tungsten and the memory element 140 comprise tungsten-oxide $WO_x$. FIG. 2C illustrates the variation in distribution of oxygen content of $WO_x$ compounds with depth from the top surface 146 for a memory element 140 with a thickness of about 140 Angstroms and formed by plasma oxidation of tungsten material. As can be seen in FIG. 2C, the oxygen content being nearly 3 at the surface indicates that $WO_3$ dominates near the surface while the lower oxygen content with depth indicates multiple compounds including $WO_3$, $W_2O_5$, $WO_2$, etc are in the deeper regions. The plasma oxidation used to form the memory element 140 produces both monotonically decreasing ion valence values ($W^{+6}$, $W^{+5}$, $W^{+4}$, and $W^0$), as well as lower oxygen content in the deeper regions.

The behavior of the switchable states of the memory element can be explained by localized states near the Fermi level, induced by the defect (oxygen vacancy) state distribution in the memory element—such as those introduced by plasma oxidation used to form the memory element. Based on this model, it is theorized that resistance switching of the memory element is the result of a changeable energy difference between the Fermi level and the edge of the localized state.

Embodiments for forming the memory element 140 in the illustrated embodiment comprising tungsten-oxide include direct plasma oxidation, down-stream plasma oxidation, thermal diffusion oxidation, sputtering, and reactive sputtering. Embodiments of the plasma oxidation process include a pure $O_2$ gas chemistry, or mix chemistries such as $O_2/N_2$, or $O_2/N_2/H_2$. In one embodiment of the down-stream plasma, the down-stream plasma is applied with a pressure of about 1500 mtorr, a power of about 1000 W, the rate of $O_2/N_2$ flow ranging from 0.1 to 100, a temperature of about 150° C., and a time duration ranging from 10 to 2000 seconds. See, for example, U.S. patent application Ser. No. 11/955,137, which is incorporated by reference herein.

In alternative embodiments the memory element 140 may comprise one or more metal oxides from the group of titanium oxide, nickel oxide, aluminum oxide, copper oxide, zirconium oxide, titanium nickel oxide, strontium zirconium oxide, and praseodymium calcium manganese oxide.

The bit lines 120, including bit line 120b acting as a top electrode for the memory cell 115, are electrically coupled to the memory elements 140 and extend into and out of the cross-section illustrated in FIG. 5B. The bit lines 120 comprise one or more layers of conductive material. For example, the bit lines 120 may comprise Ti, W, Mo, Al, Ta, Cu, Pt, Ir, La, Ni, N, O, and Ru and combinations thereof.

Dielectric 174 separates adjacent bit lines 120. In the illustrated embodiment the dielectrics 170, 172 comprise silicon oxide. Alternatively, other dielectric materials may be used.

As can be seen in the cross-sections illustrated in FIGS. 2A and 2B, the memory cells of the array 100 are arranged at the cross-point locations of the word lines 110 and bit lines 120. Memory cell 115 is representative and is arranged at the cross-point location of word line 110b and bit line 120b. Additionally, the memory elements 140 and conductive elements 150, 160 have a first width substantially the same as the width 114 of the word lines 110 (See FIG. 2A). Furthermore, the memory elements 140 and conductive elements 150, 160 have a second width substantially the same as the width 124 of the bit lines 120 (See FIG. 2B). As used herein, the term "substantially" is intended to accommodate manufacturing tolerances. Therefore, the cross-sectional area of the memory cells of array 100 is determined entirely by dimensions of the word lines 110 and bit lines 120, allowing for a high memory density for array 100.

The word lines 110 have word line widths 114 and are separated from adjacent word lines 110 by a word line separation distance 112 (See FIG. 2A), and the bit lines 120 have bit line widths 124 and are separated from adjacent bit lines 120 by a bit line separation distance 122 (See FIG. 2B). In preferred embodiments the sum of the word line width 114 and the word line separation distance 112 is equal to twice a feature size F of a process used to form the array 100, and the sum of the bit line width 124 and the bit line separation distance 122 is equal to twice the feature size F. Additionally, F is preferably a minimum feature size for a process (typically a lithographic process) used to form the bit lines 120 and word lines 110, such that the memory cells of array 100 have a memory cell area of $4F^2$.

In the memory array 100 illustrated in FIGS. 2A-2B, the memory element 140 is self-aligned with the conductive plug 150. In the manufacturing embodiment described in more detail below, the memory element 140 is formed by oxidation of the material of the conductive element 150.

In operation, bias circuitry (See, for example, biasing arrangement supply voltages, current sources 36 of FIG. 9) coupled to the corresponding word line 110b and bit line 120b applies bias arrangements across the memory cell 115 to forward bias the diode 130 and induce a programmable change in the resistance state of the memory element 140, the electrical resistance of the memory element 140 indicating the data value stored in the memory cell 115.

Figure 3:
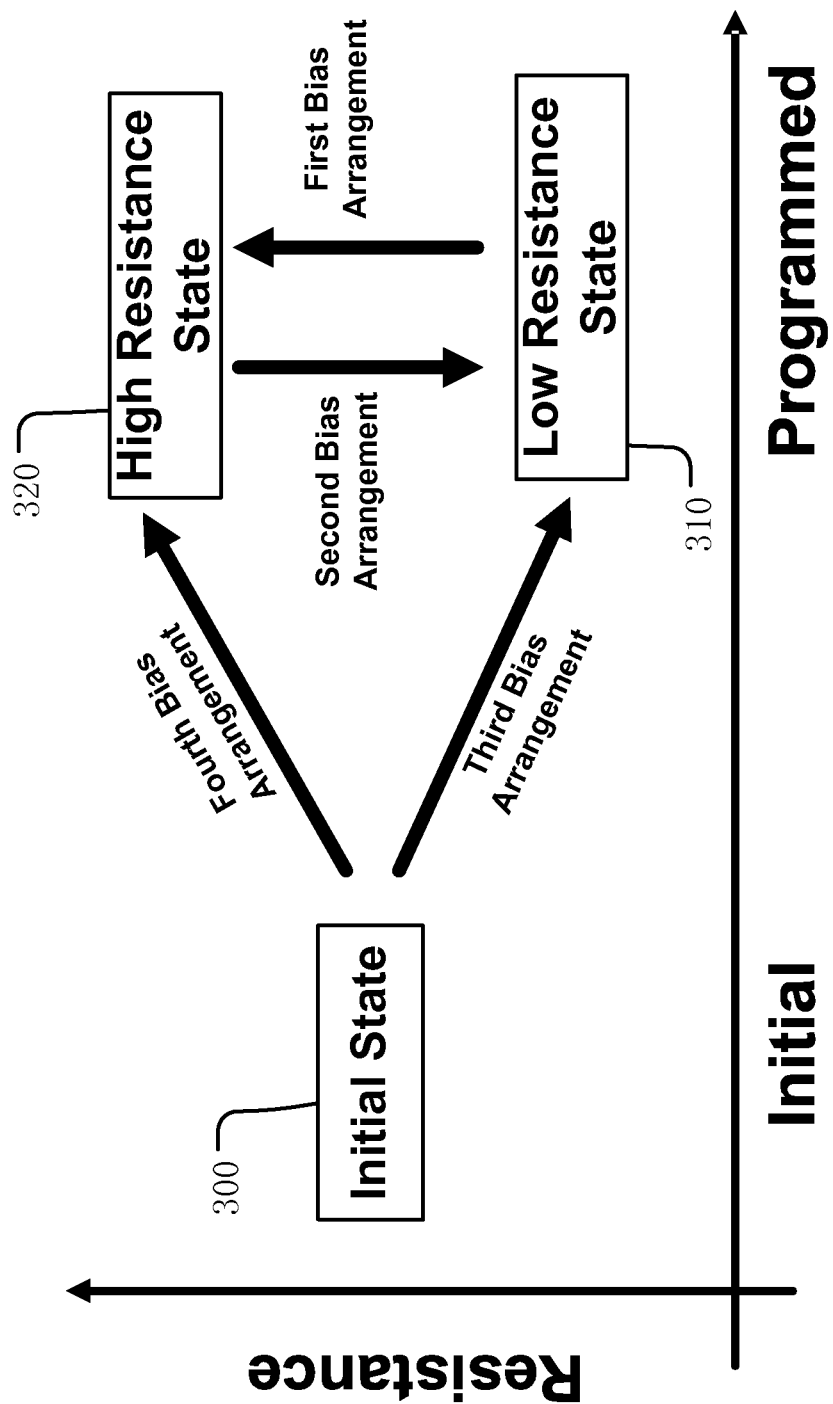
FIG. 3 conceptually illustrates the unipolar operation of the resistance state change behavior of the memory element.

FIG. 3 conceptually illustrates the unipolar operation of the resistance state change behavior of the memory element 140. Unipolar operation involves determining a data value to be stored in the memory cell 115, and then changing the resistance state of the memory element 140 by applying bias arrangements to the memory cell 115 across the series arrangement of the diode 130 and the memory element 140 to forward bias the diode 130 and store the data value in the memory cell 115. The unipolar operation of the memory element 140 allows for implementation in the high density cross-point array using the diode access devices.

As shown in FIG. 3, the memory element 140 includes an initial state 300 associated with an initial data value stored in the memory cell 115 when manufactured, a first programmed state ("Low Resistance State") 310 associated with a first programmed data value stored in the memory cell 115, and a second programmed state ("High Resistance State") 320 associated with a second programmed data value stored in the memory cell 115.

As can be seen in FIG. 3 each of the states 300, 310, 320 correspond to non-overlapping resistance ranges of the memory element 140, and thus the data value stored in the memory cell 115 can be sensed by determining the resistance of the memory element 140.

In the unipolar operation shown in FIG. 3, the bias arrangements include a first bias arrangement sufficient to forward bias the diode 130 and change the resistance of the memory element 140 from a resistance corresponding to the first programmed state 310 to a resistance corresponding to the second programmed state 320. The bias arrangements also include a second bias arrangement sufficient to forward bias the diode 130 and change the resistance of the memory element 140 from a resistance corresponding to the second programmed state 320 to a resistance corresponding to the first programmed state 310.

The bias arrangements of the unipolar operation of FIG. 3 further includes a third bias arrangement sufficient to forward bias the diode 130 and change the resistance of the memory element 140 from a resistance corresponding to the initial state 300 to a resistance corresponding to the first programmed state 310. The bias arrangements of the unipolar operation of FIG. 3 also include a fourth bias arrangement sufficient to forward bias the diode 130 and change the resistance of the memory element 140 from a resistance corresponding to the initial state 300 to a resistance corresponding to the second programmed state 320.

In embodiments the bias arrangements for unipolar operation of the memory element 140 may each comprise one or more voltage pulses, and the voltage levels and pulse times of the pulses can be determined empirically for each embodiment. The table below summarizes the bias arrangements of an embodiment of the unipolar operation of FIG. 3 for a tungsten-oxide based memory element 140. In the table below, the voltages in the column "Voltage (V)" correspond to the resultant voltage applied across the memory element 140 for a given bias arrangement. The rise and fall times of the pulses may be, for example, between 0.1 and 10 ns. In the table below the rise and fall times of the pulses are 2 ns.

| Bias Arrangement # | Voltage (V) | Pulse Length (ns) | Rise Time (ns) | Fall Time (ns) |
|---|---|---|---|---|
| First | 3.3 | 20 | 2 | 2 |
| Second | 3.3 | 500 | 2 | 2 |
| Third | 2.5 | 50 | 2 | 2 |
| Fourth | 4.5 | 50 | 2 | 2 |

Figure 4:
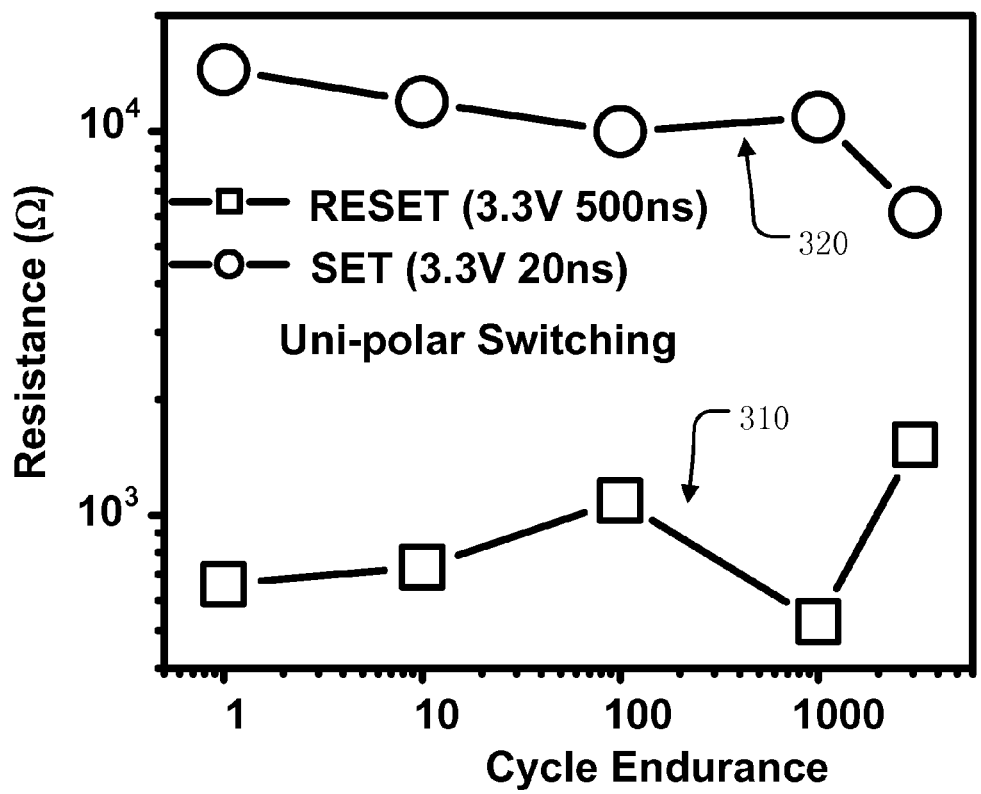
FIG. 4 illustrates measured data of a cycle endurance test of a tungsten-oxide based memory element.

FIG. 4 illustrates measured data of a cycle endurance test of a tungsten-oxide based memory element 140 between the first programmed state 310 and the second programmed state 320 using the first and second bias arrangements of the table above. In the results of FIG. 4 the first bias arrangement ("SET" in FIG. 4) comprises a voltage pulse having a magnitude of 3.3V applied across the memory element for 20 ns to induce a change in the resistance of the memory element 140 from a resistance corresponding to the first programmed state 310 to a resistance corresponding to the second programmed state 320. In the results of FIG. 4 the second bias arrangement ("RESET" in FIG. 4) comprises a voltage pulse having a magnitude of 3.3V applied across the memory element for 500 ns to induce a change in the resistance of the memory element 140 from a resistance corresponding to the second programmed state 320 to a resistance corresponding to the first programmed state 310. As can be seen in FIG. 4, the memory element 140 has a resistance ratio of a resistance corresponding to the second programmed state 320 to a resistance corresponding to the first programmed state 310 of greater than or equal to about 10 after 1000 cycles of the first and second bias arrangements, demonstrating good cycle endurance for the memory element 140.

In the results of FIG. 4 the first and second bias arrangements comprise a 3.3V applied across the tungsten-oxide memory element 140 for 20 ns and 500 ns respectively. Thus, the tungsten-oxide memory element 140 demonstrates fast operational switching speed, and also demonstrates low voltage operation which may eliminate the need for a voltage pumping circuit. Additionally, since in embodiments the same voltage level can be used for both the first and second bias conditions the bias circuitry can be simplified.

FIGS. 5-8 illustrate steps in a fabrication sequence for manufacturing the cross-point array 100 of memory cells as illustrated in FIGS. 2A-2B.

FIGS. 5A-5B illustrate cross-sectional views of a first step of forming word lines 110 on a substrate and dielectric 170 on the word lines 110. The word lines 110 extend in a first direction into and out of the cross-section illustrated in FIG. 5A, and in the illustrated embodiment comprise doped semiconductor material. The word lines 110 have word line width 114 and adjacent word lines are separated by word line separation distance 112.

Figure 6A:
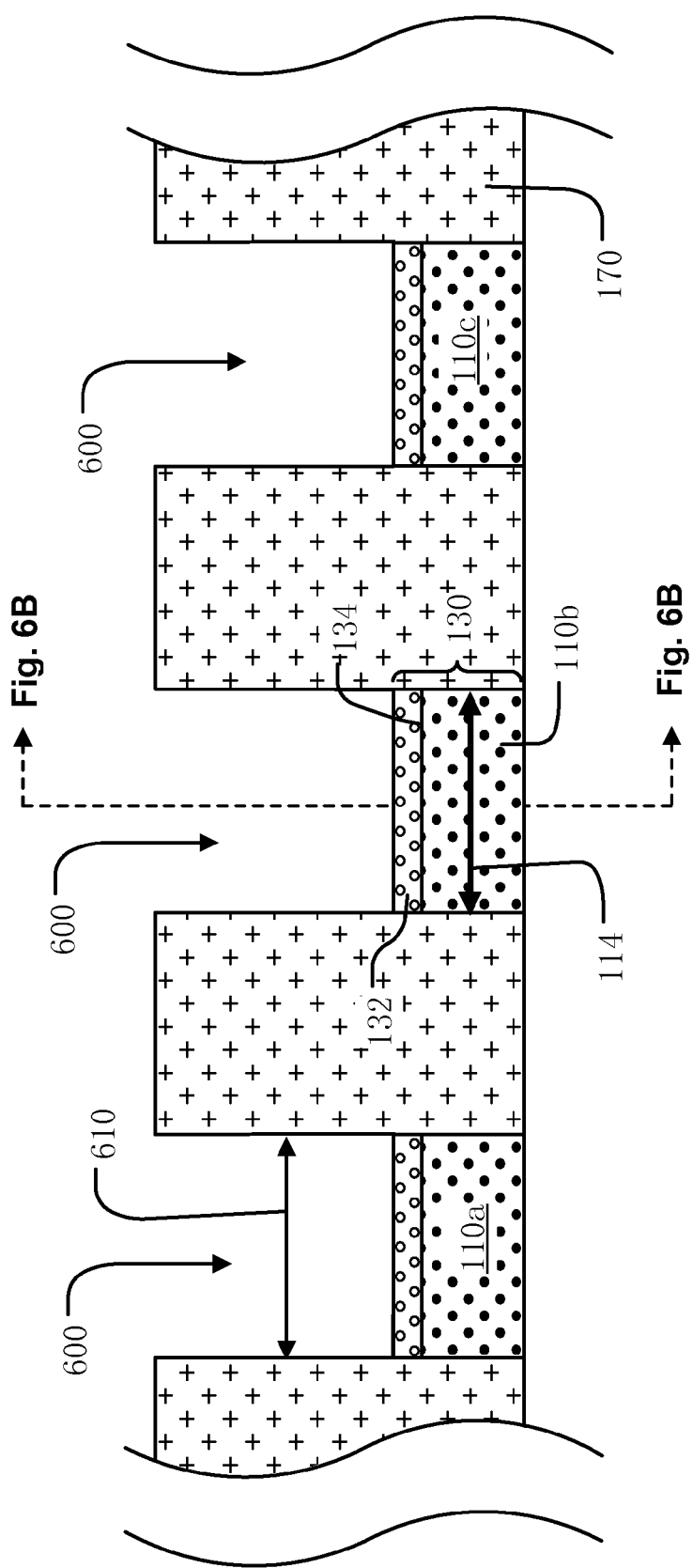
Figure 6B:
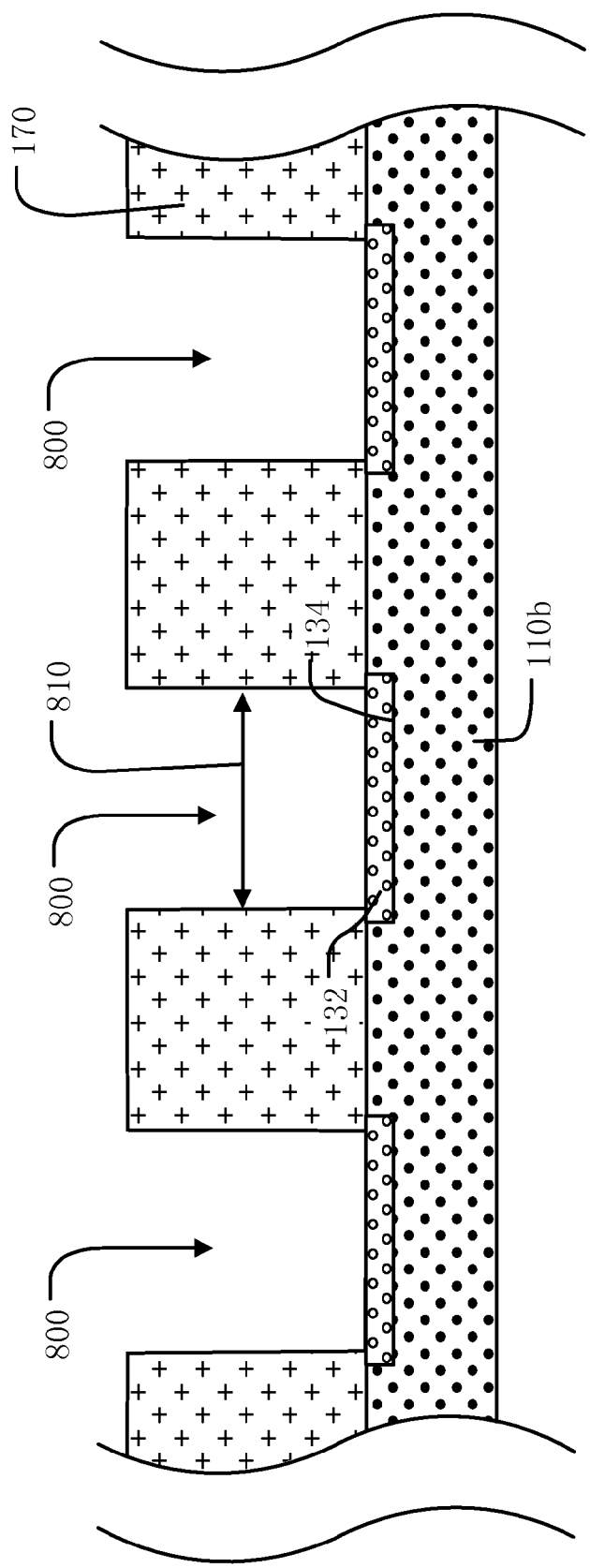

Next, an array of vias 600 having width 610 are formed in the dielectric 170 to expose portions of the word lines 110, and the doped semiconductor regions 132 are formed within the word lines 110, for example by ion implantation, resulting in the structure illustrated in the cross-sectional views of FIGS. 6A-6B. The doped semiconductor regions 132 have a conductivity type opposite that of the word lines 110. Thus the doped semiconductor regions 132 and word lines 110 define pn junctions 134, and the diode 130 comprises the doped semiconductor regions 132 and a portion of the word line 110 adjacent the doped semiconductor regions 132.

Figure 7B:
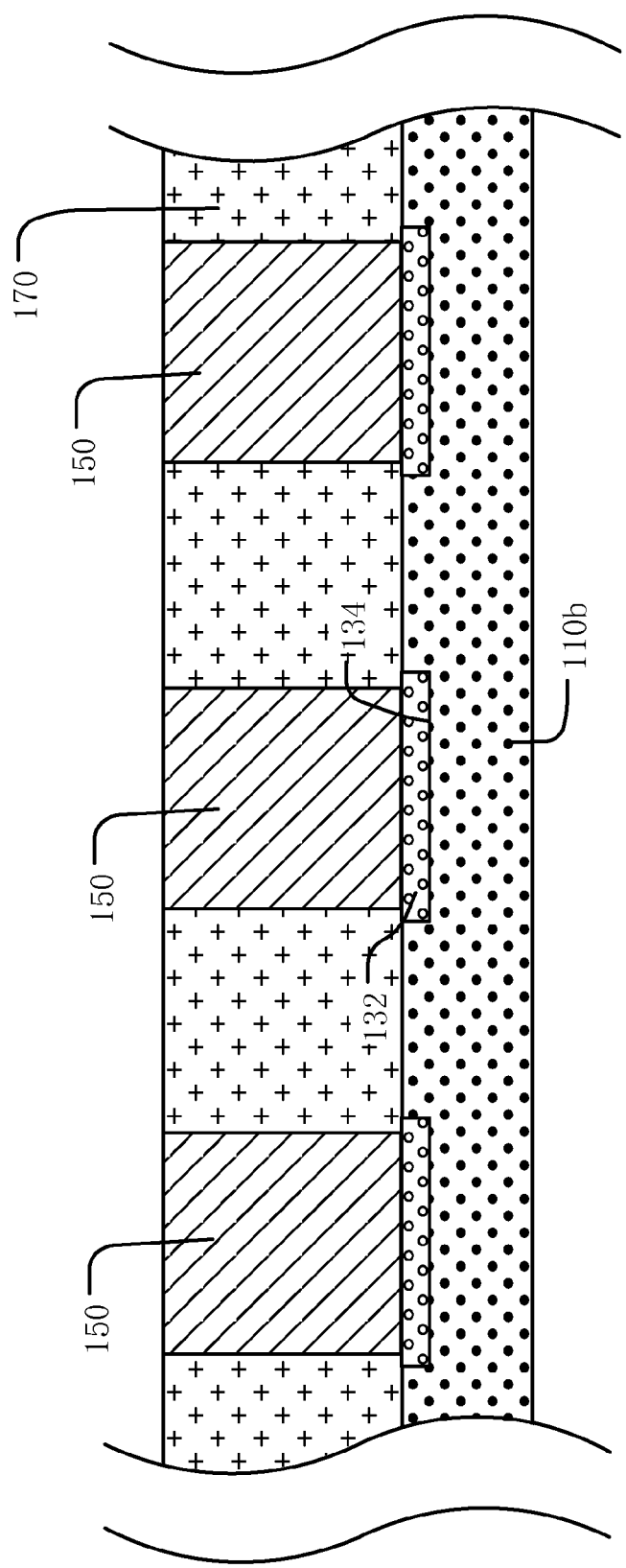

Next, conductive elements 150 are formed within the vias 600 of FIGS. 6A-6B, resulting in the structure illustrated in the cross-sectional views of FIGS. 7A-7B. The conductive elements 150 in the illustrated embodiment comprise tungsten material and can be formed within the vias 600 by Chemical Vapor Deposition CVD of tungsten material, followed by a planarization step such as Chemical Mechanical Polishing CMP.

Figure 8B:
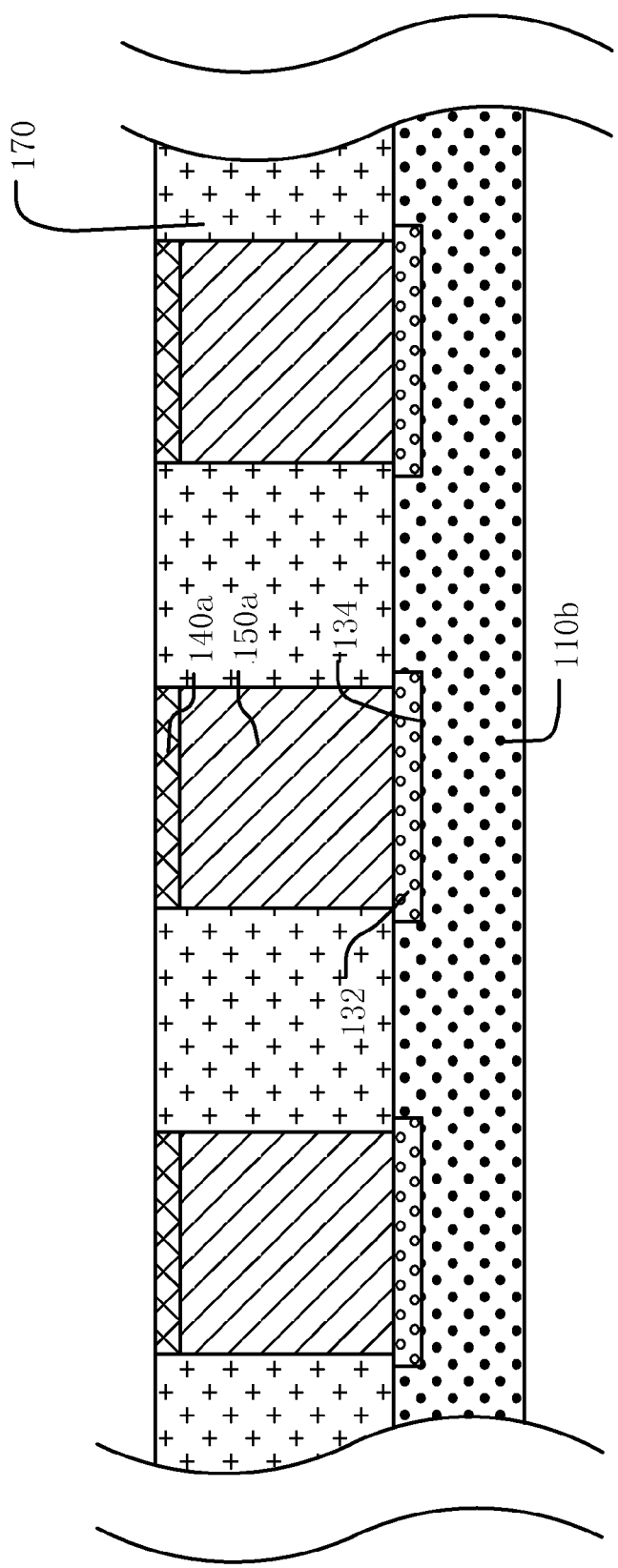

Next, oxidation of a portion of the conductive elements 150 forms memory elements 140 self-aligned with the remaining portion of the corresponding conductive elements 150, resulting in the structure illustrated in the cross-sectional views of FIGS. 8A and 8B. The oxidation can comprise plasma oxidation and an optional thermal oxidation step. For example, direct oxygen plasma oxidation or downstream oxygen plasma oxidation may be used. Embodiments include pure $O_2$ gas chemistry, or mixed chemistries such as $O_2/N_2$ or $O_2/N_2/H_2$. Since the memory elements 140 are formed by oxidation of the conductive elements 150, no additional masks are necessary to form the memory elements 140.

Next, the metal-oxide memory element 140 is optionally cured by exposing the metal-oxide memory element 140 to a gas comprising at least one of nitrogen, hydrogen, and argon, at a temperature greater than 100 degrees Celsius. More preferably the metal-oxide memory element 140 is exposed to the gas at a temperature greater than 150 degrees Celsius. Exposing the metal-oxide memory element 140 to the gas can be carried out using any suitable high temperature system including, for example, a furnace system or a rapid thermal pulse ("RTP" system). The time, temperature, and the pressure of the exposure process will depend on a number of factors, including the system used, and will vary from embodiment to embodiment. For example, the temperature can range from 150 degrees C. to 500 degrees C. with a time of 10 to 10,000 seconds, at a pressure of between $10^{-5}$ and $10^{-2}$ torr. As discussed in more detail below with respect to FIGS. 11A-11B, curing the metal-oxide memory element as described herein is shown to improve the resistive switching performance and the cycle endurance of the metal-oxide memory element 140.

Next, bit lines 130 separated by dielectric 174 are formed on the structure illustrated in FIGS. 8A-8B, resulting in the cross-point array 100 illustrated in FIGS. 2A-2B. In some embodiments, the optional exposure process of the memory element 140 as discussed above with respect to FIGS. 8A-8B is instead performed on the bit lines 130. Bias circuitry such as supply voltages and/or current sources can be formed on the same device as the memory elements and coupled to the word lines 110 and bit lines 120 for applying bias arrangements as described herein. The bit lines 130 and dielectric 174 may be formed by patterning a bit line material on the structure in FIGS. 8A-8B, forming dielectric on the bit lines 130, and performing a planarizing process such as Chemical Mechanical Polishing CMP.

FIG. 9 is a simplified block diagram of an integrated circuit 10 including a cross-point memory array 100 of memory cells having a metal-oxide based memory element and a diode access device as described herein. A word line decoder 14 is coupled to and in electrical communication with a plurality of word lines 16. A bit line (column) decoder 18 is in electrical communication with a plurality of bit lines 20 to read data from, and write data to, the memory cells (not shown) in array 100. Addresses are supplied on bus 22 to word line decoder and drivers 14 and bit line decoder 18. Sense amplifiers and data-in structures in block 24 are coupled to bit line decoder 18 via data bus 26. Data is supplied via a data-in line 28 from input/output ports on integrated circuit 10, or from other data sources internal or external to integrated circuit 10, to data-in structures in block 24. Other circuitry 30 may be included on integrated circuit 10, such as a general purpose processor or special purpose application circuitry, or a combination of modules providing system-on-a-chip functionality supported by array 100. Data is supplied via a data-out line 32 from the sense amplifiers in block 24 to input/output ports on integrated circuit 10, or to other data destinations internal or external to integrated circuit 10.

A controller 34 implemented in this example, using a bias arrangement state machine, controls the application of bias arrangement supply voltages 36, such as read, program, and program verify voltages. Controller 34 may be implemented using special-purpose logic circuitry as known in the art. In alternative embodiments, controller 34 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 34.

As described above with respect to FIGS. 8A-8B, during manufacturing of memory cells with diode access devices, the metal-oxide memory element 140 can be cured by exposing the metal-oxide memory element to a gas comprising at least one of nitrogen, hydrogen, and argon. More generally the curing process can be performed on metal-oxide memory elements implemented in various types of memory cells, including memory cells having transistor access devices, as discussed below with reference to FIGS. 10A-10D.

FIGS. 10A-10D illustrate cross-sectional views of steps in a process for manufacturing a memory cell 1000 having a metal-oxide memory element 1040.

FIG. 10A illustrates a first step of forming a dielectric 1060 on a bottom electrode 1010, and etching the dielectric 1060 to form a via 1100 extending through the dielectric 1060 to the bottom electrode 1010. In the illustrated embodiment the dielectric 1060 comprises silicon dioxide, although other dielectric materials can also be used.

The bottom electrode 1010 is an electrically conductive element. For example, the bottom electrode 1010 may be doped semiconductor material such as a terminal of an access transistor. Alternatively, the bottom electrode 1010 may comprise, for example, one or more elements selected from the group consisting of Ti, W, Mo, Al, Ta, Cu, Pt, It, La, Ni, N, O, and Ru and combinations thereof. In some embodiments the bottom electrode comprises more than one layer of material.

Next, conductive element 1080 is formed within the via 1100, resulting in the structure illustrated in the cross-sectional view of FIG. 10B. The conductive element 1080 comprises tungsten material in the illustrated embodiment and can be formed within the via 1100 by Chemical Vapor Deposition CVD followed by a planarization step such as Chemical Mechanical Polishing CMP.

Next, oxidation of a portion of the conductive element 150 forms memory element 1040 self-aligned with the remaining portion of the conductive element 1050, resulting in the structure illustrated in FIG. 10C. In the illustrated embodiment the conductive element 1080 comprises tungsten material, and thus the memory element 1040 comprises tungsten-oxide. In alternative embodiments the memory element 1040 may comprise other metal-oxides such as titanium oxide, nickel oxide, aluminum oxide, copper oxide, zirconium oxide, niobium oxide, tantalum oxide, titanium-nickel oxide, Cr doped $SrZrO_3$, Cr doped $SrTiO_3$, PCMO, and LaCaMnO.

Methods for forming the memory element 1040 include, for example, the processes discussed above with respect to FIGS. 1 and 8A-8B. Thus in embodiments the memory element 1040 can have a variation in the distribution of oxygen compounds with depth from the top surface of the memory element 1040 which results both monotonically decreasing ion value values of the material of the conductive element 1050, as well an oxygen content which increases with distance from the conductive element 1050.

Next, the metal-oxide memory element 140 is cured by exposing the metal-oxide memory element to a gas comprising at least one of nitrogen, hydrogen, and argon, at a temperature greater than 100 degrees Celsius. More preferably the metal-oxide memory element 140 is exposed to the gas at a temperature greater than 150 degrees Celsius. The time, temperature, and the pressure of the exposure process will depend on a number of factors, including the system used, and will vary from embodiment to embodiment. The curing can be carried our, for example, using the systems discussed above with respect to FIGS. 8A-8B.

Next, top electrode 1020 is formed on the structure illustrated in FIG. 10C, resulting in the structure illustrated in the cross-sectional view of FIG. 10D. The top electrode 1020 may comprise any of the materials discussed above with respect to the bottom electrode 1010.

Reading or writing to the memory cell 1000 can be achieved by applying appropriate bias arrangements across the memory element 1040. The bias arrangements comprise applying voltages to one or both of the top and bottom electrodes 1020, 1010 to induce current through the memory element 1040. The levels and durations of the voltages applied are dependent upon the operation performed (e.g. a read operation or a programming operation) and can be determined empirically for each embodiment. The bias arrangements may include pulses having a positive voltage from the top electrode 1020 to the bottom electrode 1010 (referred to herein as a positive voltage across the memory element 1040), and/or may include pulses having a negative voltage from the top electrode 1020 to the bottom electrode 1010 (referred to herein as a negative voltage across the memory element 1040).

Figure 11A:
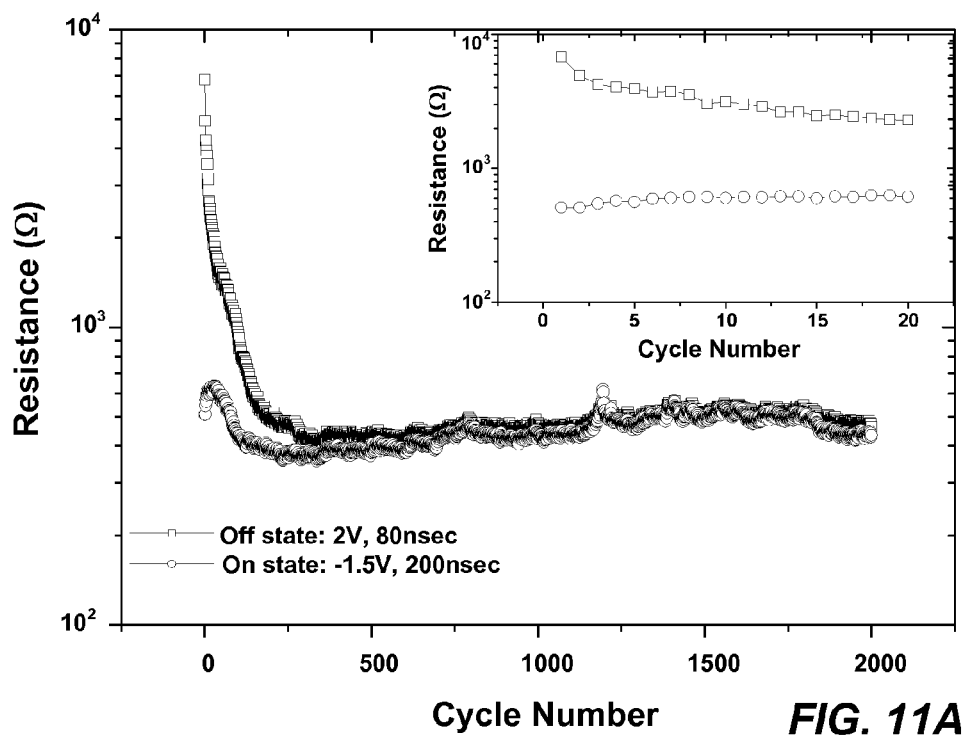
FIGS. 11A and 11B are cycle-endurance measurements of tungsten-oxide memory elements formed without and with curing of the memory element.
Figure 11B:
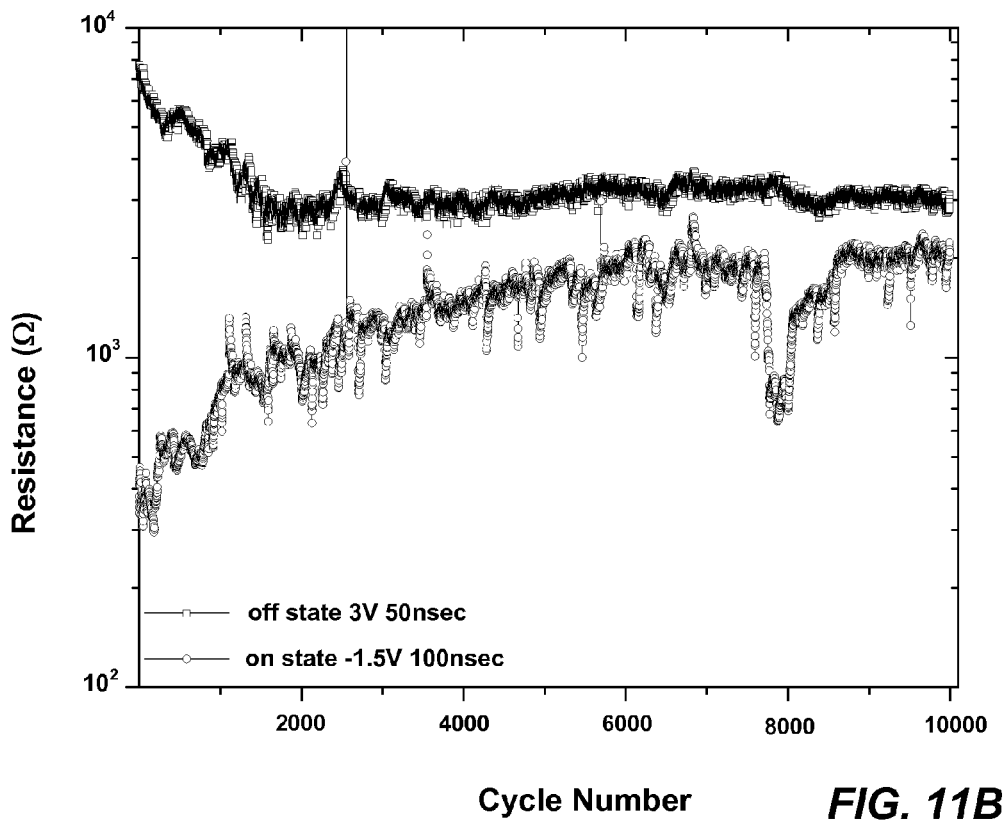

FIGS. 11A and 11B are cycle-endurance measurements of tungsten-oxide memory elements formed without and with curing of the memory element to a gas as described herein. The oxidation process used to form the tungsten-oxide memory elements was by down-stream plasma oxidation at 150° C. for 400 sec with an $O_2/N_2$ ratio of 20.

FIG. 11A is a plot of the measured resistance of an un-cured tungsten-oxide memory element versus cycle number between high and low resistance states. In the data of FIG. 11A, a pulse of 2V with a pulse width of 80 nsec was applied across the memory element to induce a resistive change from the lower resistance ("On") state to the higher resistance ("Off") state. A pulse of −1.5V with a pulse width of 200 nsec was applied across the memory element to induce a resistive change from the higher resistance state to the lower resistance state. In the data of FIG. 11A, the pulses used had rise and fall times of 2 ns. In alternative embodiments, the rise and fall times may be, for example, between 0.1 and 10 ns.

As can be seen in FIG. 11A, the un-cured tungsten-oxide memory element shows a significant reduction in the resistance of the higher resistance state with cycling. As a result, the un-cured tungsten-oxide memory element eventually fails to exhibit resistive switching behavior after a few hundred cycles.

FIG. 11B is a plot of the measured resistance of a cured tungsten-oxide memory element versus cycle number between high and low resistance states. The tungsten-oxide memory element was cured using $N_2$ gas at 400° C. for 33 minutes. In the data of FIG. 11B, a pulse of 3V with a pulse width of 50 nsec was applied across the memory element to induce a resistive change from the lower resistance ("On") state to the higher resistance ("Off") state. A pulse of −1.5V with a pulse width of 100 nsec was applied across the memory element to induce a resistive change from the higher resistance state to the lower resistance state. In the data of FIG. 11B, the pulses used had rise and fall times of 2 ns. In alternative embodiments, the rise and fall times may be, for example, between 0.1 and 10 ns.

As can be seen by comparing FIG. 11B with FIG. 11A, the cured memory element exhibits a larger resistance in the high resistance state and significantly improved cycle endurance and stable resistive switching behavior after 10,000 cycles. It is theorized that the improved cycle endurance may be the result of a modification of the interface between the memory element 1040 and the eventually formed top electrode 1020 by the curing process.

In the illustrated embodiment of FIGS. 10A-10D, the metal-oxide memory element 1040 was cured by exposing the metal-oxide memory element to the gas, followed by the formation of the top electrode 1020. Alternatively, the top electrode 1020 may be formed prior to the curing process being performed, in which case the top electrode 1020 is exposed to the gas rather than the memory element 1040. Since it is theorized that the improved cycle endurance may be the result of a modification of the interface between the memory element 1040 and the top electrode 1020 by the curing process, exposing the top electrode 1020 may also result in the improved cycle endurance.

Curing tungsten-oxide memory elements as described herein has been shown to improve the cycle endurance and resistive switching characteristics of the memory element. As described below, the curing process may also be used on other metal-oxides such as titanium oxide, nickel oxide, aluminum oxide, copper oxide, zirconium oxide, niobium oxide, tantalum oxide, titanium-nickel oxide, Cr doped $SrZrO_3$, Cr doped $SrTiO_3$, PCMO, and LaCaMnO. It is theorized that the resistive switching behavior of tungsten-oxide as well as other metal-oxides may be due to the rupture and formation of filaments (a filament may be composed of ions or vacancies), and that the number of remaining filaments determines the resistance of the metal-oxide. Thus, the curing process may be extended to other metal-oxides which may be characterized by resistive switching behavior which depends upon the rupture and formation of filaments.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for manufacturing a memory cell array, the method comprising:
   forming a plurality of word lines comprising doped semiconductor material having a first conductivity type;
   forming a dielectric overlying the word lines and an array of vias in the dielectric to expose portions of the word lines;
   forming a plurality of doped semiconductor regions within the exposed portions of the word lines, the doped semiconductor regions having a conductivity type opposite the first conductivity type, whereby diodes are formed;
   forming a plurality of metal-oxide memory elements within the array of vias, the memory elements programmable to a plurality of resistance states including a first and a second resistance state;
   forming conductive elements underlying metal-oxide memory elements and electrically coupling the respective metal-oxide memory elements to the doped semiconductor regions, wherein the metal-oxide memory elements comprise respective metal-oxide bodies that have oxygen contents which increase with distance from the conductive elements; and
   forming a plurality of bit lines overlying the plurality of metal-oxide memory elements.

2. The method of claim 1, further comprising forming bias circuitry coupled to the word lines and bit lines for applying bias arrangements across the series arrangement of selected word lines, selected metal-oxide memory elements and selected bit lines, the bias arrangements including:
   a first bias arrangement to forward-bias the diode of a selected metal-oxide memory element and change the resistance state of the metal-oxide memory element from the first resistance state to the second resistance state; and
   a second bias arrangement to forward-bias the diode of the selected metal-oxide memory element and change the resistance state of the metal-oxide memory element from the second resistance state to the first resistance state.

3. The method of claim 1 including:
   depositing conductive material with the array of vias and performing a planarization process to form the plurality of conductive elements; and
   oxidizing a portion of the plurality of conductive elements to form the plurality of metal-oxide memory elements by a process which results in an oxygen content of the memory elements which increases with distance from the conductive elements.

4. The method of claim 3, wherein the forming a plurality of metal-oxide memory elements further comprises exposing the plurality of metal-oxide memory elements to a gas comprising at least one of nitrogen, hydrogen, and argon, at a temperature greater than 100 degrees Celsius.

5. The method of claim 4, wherein exposing the plurality of metal-oxide memory elements comprises exposing at a temperature between 150 degrees Celsius and 500 degrees Celsius.

* * * * *